United States Patent [19]
Lin

[11] Patent Number: 6,057,064
[45] Date of Patent: May 2, 2000

[54] DOUBLE-ALTERNATING PHASE-SHIFTING MASK

[75] Inventor: Benjamin Szu-Min Lin, Chiayi, Taiwan

[73] Assignee: United Microelectronics Corp., Hsinchu, Taiwan

[21] Appl. No.: 09/083,209

[22] Filed: May 21, 1998

[30] Foreign Application Priority Data

Nov. 25, 1997 [TW] Taiwan ................................ 86117701

[51] Int. Cl.⁷ ..................................................... G03F 9/00
[52] U.S. Cl. ..................................................... 430/5
[58] Field of Search ............................... 430/5, 311, 322, 430/323

[56] References Cited

U.S. PATENT DOCUMENTS 5,585,210 12/1996 Lee et al. ..................................... 430/5
5,725,969 3/1998 Lee ............................................... 430/5

Primary Examiner—S. Rosasco
Attorney, Agent, or Firm—Hickman Stephens & Colema LLP

[57] ABSTRACT

A double-alternating phase-shifting mask (PSM) is provided for use in photolithography for pattern definition of contact holes in semiconductor fabrication, which can eliminate the side-lobe effect that would otherwise cause ghost lines in the resulted pattern definition. The double-alternating PSM comprises a quartz substrate and a masked area formed on said quartz substrate with the unmasked areas being defined as contact hole patterns. The masked area includes a first shifter layer formed over said quartz substrate and a second shifter layers formed over said quartz substrate at those positions each substantially in the geometric center of each group of neighboring contact hole patterns.

8 Claims, 5 Drawing Sheets

DOUBLE-ALTERNATING PHASE-SHIFTING MASK

CROSS-REFERENCE TO RELATED APPLICATION

This application claims the priority benefit of Taiwan application Ser. No. 86117701, filed Nov. 25, 1997, the full disclosure of which is incorporated herein by reference.

BACKGROUND OF THE INVENTION

1. Field of the Invention

This invention relates to semiconductor fabrication technologies, and more particularly, to a double-alternating phase-shifting mask (PSM) for use in photolithography in semiconductor fabrication processes. PSM can eliminate ghost lines that would otherwise occur due to side-lobe effect in the resulted pattern definition.

2. Description of Related Art

In semiconductor fabrication, photolithography is an important and indispensable technique which is used to transfer circuit layout patterns through a mask onto predefined locations on a semiconductor wafer. Many processes in semiconductor fabrications, such as etching and ion implantation, require the use of photolithography. In a photolithographic process, resolution and depth of focus (DOF) are two major checkpoints used to appraise the quality of the pattern definition. A high level of integration requires a high resolution of pattern definition since the feature size is very small. To increase the resolution, a laser source with a very short wavelength, such as a krypton (Kr) deep ultraiolet laser with a wavelength of 2,480 Å (angstrom), is used as the exposure light in the photolithographic process. The use of a short-wavelength exposure light, however, will result in a shallow DOF. To allow high resolution and good DOF, one solution is to use the so-called phase-shifting mask (PSM).

Fundamentally, a PSM is formed by adding phase shifter layers on a conventional mask that can cause destructive interference to the light passing through it such that the contrast and resolution of the resulting pattern definition can be increased. One benefit of the PSM is that it can increase the resolution of pattern definition without having to change the wavelength of the exposure light.

In semiconductor fabrications, hole patterns are usually required to define contact holes in the wafer. Conventionally, the so-called half-tone phase shift mask (HTPSM) is used to define contact hole patterns with a large DOF. A conventional HTPSM photolithographic process is illustratively depicted in the following with reference to FIGS. 1A–1C, wherein FIG. 1A is a schematic top view of the conventional HTPSM, FIG. 1B is a cross-sectional view taken along the line I—I of the conventional HTPSM in FIG. 1A and FIG. 1C is a graph showing the distribution of light intensity over a wafer from an exposure light passing through the conventional HTPSM of FIG. 1B.

As shown, the conventional HTPSM includes a quartz substrate 14 and a shifter layer 12 formed over the quartz substrate 14. The shifter layer 12 can be, for example, a layer of $MoSi_zO_xN_y$. Since positive photoresist is typically used in the photolithographic process for forming contact holes, the portions of the quartz substrate 14 that are uncovered by the shifter layer 12, as designated by the reference numeral 10, are defined as contact hole patterns used for pattern definition of contact holes. The shifter layer 12 has light transmittance of from 3% to 10% and is capable of causing a phase shift of 180° to the light passing through it. By contrast, the light passing through the contact hole patterns 10 has no shift in angle. The phase shift and the intensity of the light passing through the conventional HTPSM are illustrated in FIG. 1C. As shown, the light passing through the contact hole patterns 10 is not shifted in phase and has a high intensity, while the light passing through the shifter layer 12 is shifted in phase by 180° and is attenuated in intensity. Therefore, near the borderlines between the contact hole patterns 10 and the shifter layer 12, the light passing through the transparent contact hole patterns 10 and the light passing through the shifter layer 12 are subjected to destructive interference, thus forming a zero point that would increase the contrast of the resulted pattern definition on the photoresist layer. The resulted pattern definition is thus higher in resolution.

The foregoing conventional HTPSM, however, has the drawback of a side-lobe effect due to the diffractions of the exposure light passing through the contact hole patterns 10, which is particularly noticeable when the duty ratio (the ratio of the size of each contact hole pattern to the separation between two neighboring contact hole patterns) is close to one. The side-lobe effect can cause ghost lines between those locations on the wafer where the contact holes are defined. In the case of FIG. 1A, for example, the exposure light passing through the contact hole patterns 10a, 10b, 10c, 10d can cause the appearance of ghost lines at a point on the wafer corresponding to the point C between the contact hole patterns 10a, 10b, 10c, 10d.

SUMMARY OF THE INVENTION

It is therefore an objective of the present invention to provide a double-alternating PSM for use in photolithography in semiconductor fabrication, which can liminate the side-lobe effect that would otherwise cause ghost lines in the resulted pattern definition.

In accordance with the foregoing and other objectives of the present invention, a double-alternating PSM for use in photolithography in semiconductor fabrication is provided. The double-alternating PSM of the invention comprises a quartz substrate and a masked area formed on said quartz substrate with the unmasked areas being defined as contact hole patterns. The masked area includes a first shifter layer formed over said quartz substrate and second shifter layers formed over said quartz substrate at those positions each substantially in the geometric center of each group of neighboring contact hole patterns.

The invention is characterized in that the first shifter layer is capable of causing a first phase shift to the light passing through it and said first shifter layer is capable of causing a second phase shift to the light passing through it, wherein the difference between the first phase shift and the second phase shift is substantially 180°. Preferably, in practice, the first shifter layer is designed to cause a phase shift of 180° to the light passing through it, while the second shifter layers are designed to cause a phase shift of 0° to the light passing through it. The first and second shifter layers can be either made from the same optical material or from two different optical materials. In either case, the first and second shifter layers are shaped with suitable thicknesses so as to allow them to provide the required phase difference of 180° between the light passing through the first shifter layer and the light passing through the second shifter layers. The first and second shifter layers each have a light transmittance of about 3% to 10%.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 2A:
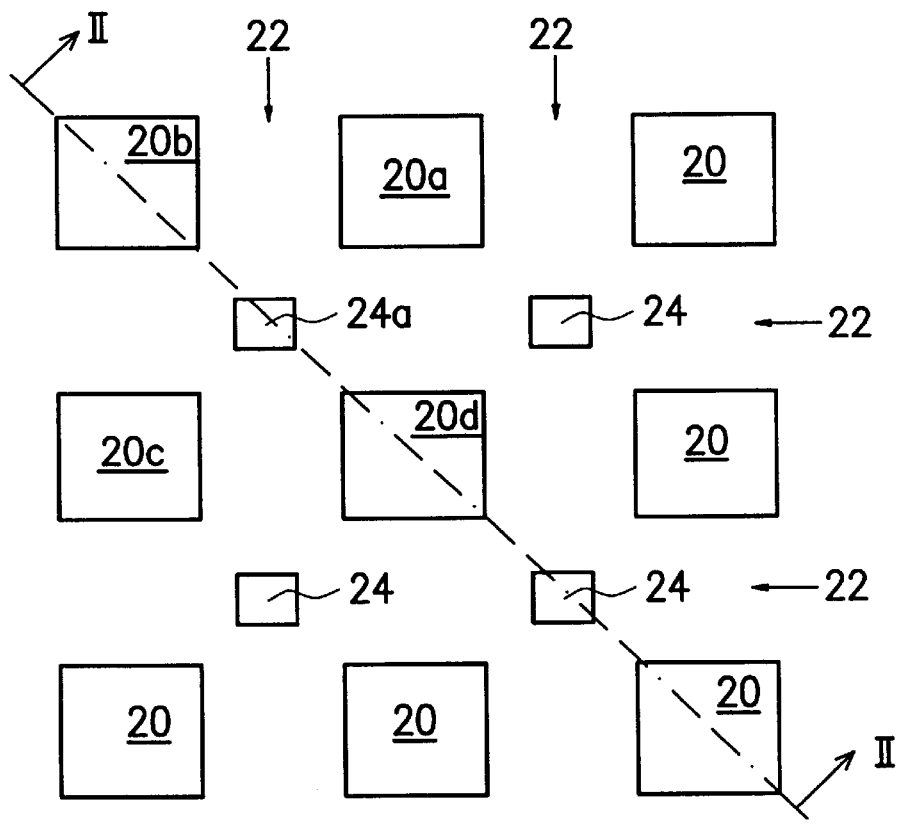
FIG. 2A is a schematic top view of the double-alternating PSM according to the invention.
Figure 2B:
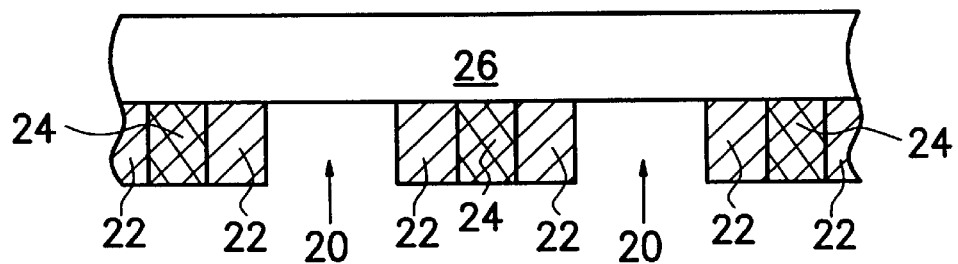
FIG. 2B is a cross-sectional view cut along the line II—II of the double-alternating PSM of FIG. 2A.
Figure 2C:
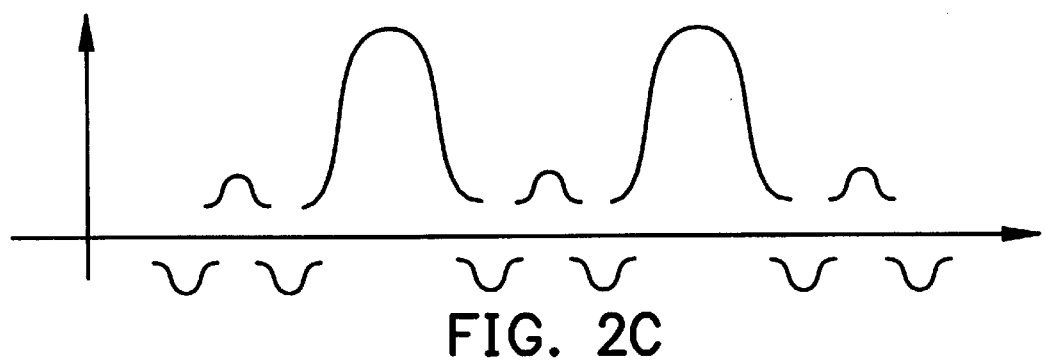
FIG. 2C is a graph showing the distribution of light intensity over a wafer from an exposure light passing through the double-alternating PSM of FIG. 2B.

A preferred embodiment of the double-alternating PSM of the invention is illustratively depicted in the following with reference to FIGS. 2A–2C, wherein FIG. 2A is a schematic top view of the double-alternating PSM according to the invention, FIG. 2B is a cross-sectional view cut along the line II—II of the double-alternating PSM of FIG. 2A and FIG. 2C is a graph showing the distribution of light intensity over a wafer due to an exposure light passing through the double-alternating PSM of FIG. 2B. As shown, the double-alternating PSM of the invention includes a quartz substrate 26 on which a first shifter layer 22 and a plurality of second shifter layers 24 are formed. The first and second shifter layers 22, 24 in combination define a masked area, with those areas uncovered by the masked area being defined as the contact hole patterns 20 (including those designated by the reference numerals 20a, 20b, 20c, 20d).

The first shifter layer 22 has a light transmittance of 3% to 10% and is designed to be capable of causing a phase shift of 180° to the light passing through it. The second shifter layers 24 are provided at those locations where the ghost lines as mentioned in the background section of this specification would otherwise occur. In the case of FIG. 2A, for example, the second shifter layers 24 are each provided substantially in the center of each square group of four neighboring contact hole patterns, as those designated by the reference numerals 20a, 20b, 20c, 20d (the bounded second shifter layer is here designate by the reference numeral 24a). The second shifter layer 24a is preferably located at the geometrical center of the square figure formed by connecting the four contact hole patterns 20a, 20b, 20c, 20d.

Figure 1A:
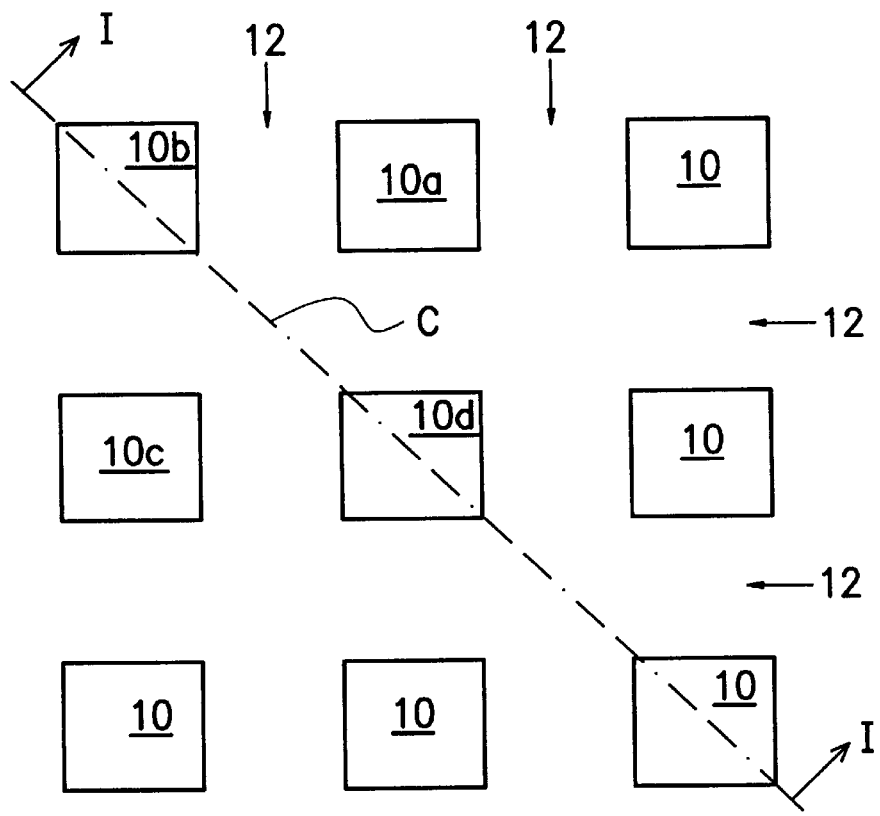
FIG. 1A is a schematic top view of a conventional HTPSM.
Figure 1B:
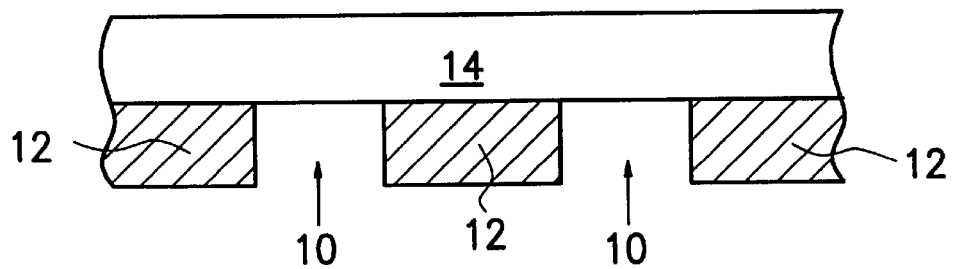
FIG. 1B is a cross-sectional view cut along the line I—I of the conventional HTPSM of FIG. 1A.
Figure 1C:
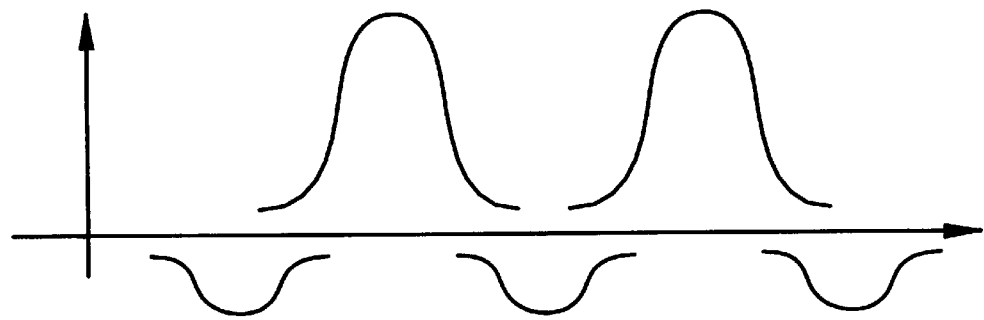
FIG. 1C is a graph showing the distribution of light intensity over a wafer due to an exposure light passing through the conventional HTPSM of FIG. 1B.

Since in practice the contact hole patterns 20 can be randomly spread over the wafer instead of the regularly arranged square array shown in FIG. 1A, the general rule for positioning the second shifter layers 24 is as follows: disposing each second shifter layer substantially in the geometric center of each group of neighboring contact hole patterns that, when connected, forms a quadrilateral figure.

Figure 2D:
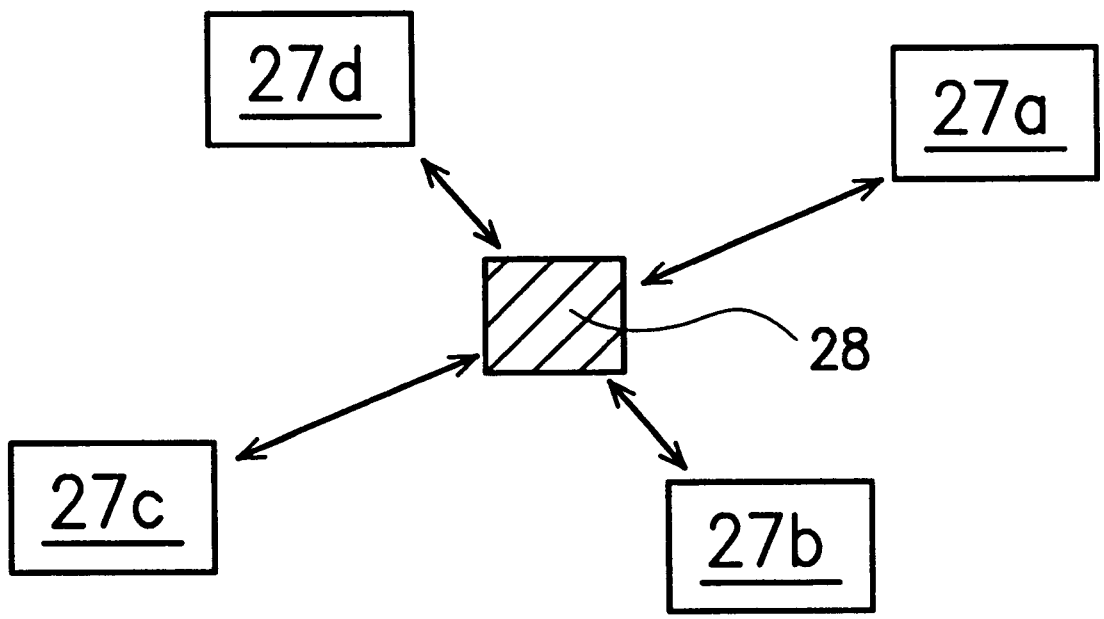
FIG. 2D is a schematic top view showing a variation to the double-alternating PSM of the invention.

FIG. 2D shows an example of four contact hole patterns, here designated by the reference numerals 27a, 27b, 27c, 27d, which are irregularly arranged at various positions. When connected, these four contact hole patterns 27a, 27b, 27c, 27d form a quadrilateral figure (not a square as in the case of FIG. 1A). The second shifter layer, here designated by the reference numeral 28, is preferably positioned at the geometrical center of the quadrilateral figure formed by connecting the four contact hole patterns 27a, 27b, 27c, 27d. The geometric center of this quadrilateral figure can be found by using principles of fundamental geometry, so description thereof will not be further detailed.

When the exposure light passes through the foregoing PSM in a photolithographic process, it is desired that the difference between the phase shift caused by the first shifter layer 22 and the phase shift caused by the second shifter layers 24 be exactly 180° for destructive interference. Therefore, in design, the first shifter layer 22 is preferably designed to cause a phase shift of 0° to the light passing through it, while the second shifter layers 24 is designed to cause a phase shift of 180° to the light passing through it. Further, both the first shifter layer 22 and the second shifter layers 24 have the same transmittance to the light passing through them, which is in the range of 3% to 10%. As illustrated in FIG. 2C, the light passing through this PSM can result in a zero point at the borderlines between the contact hole patterns 20 and the first shifter layer 22, so that the contrast of the resulting pattern definition for the contact holes is increased. Further, for the masked areas (i.e., the first and second shifter layers 22, 24), the light passing through the first shifter layer 22 will result in a phase shift of 180°, while the light passing through the second shifter layers 24 will result in a phase shift of 0°. A 180°–0°–180° alternating distribution pattern results. In this manner, the light passing through the first and second shifter layers 22, 24 can result in a zero point at the borderlines between the first shifter layer 22 and the second shifter layers 24, thus allowing the elimination of ghost lines within these masked areas.

Broadly speaking, the double-alternating PSM of the invention is characterized by the first and second shifter layers 22, 24 each having a transmittance of from 3% to 10% and by the difference between the phase shift caused by the first shifter layer 22 and the phase shift caused by the second shifter layers 24 being exactly 180°. Preferably, the first shifter layer 22 is designed to cause a phase shift of 180° to the light passing through it, while the second shifter layers 24 are designed to cause a phase shift of 0° to the light passing through them.

Figure 3A:
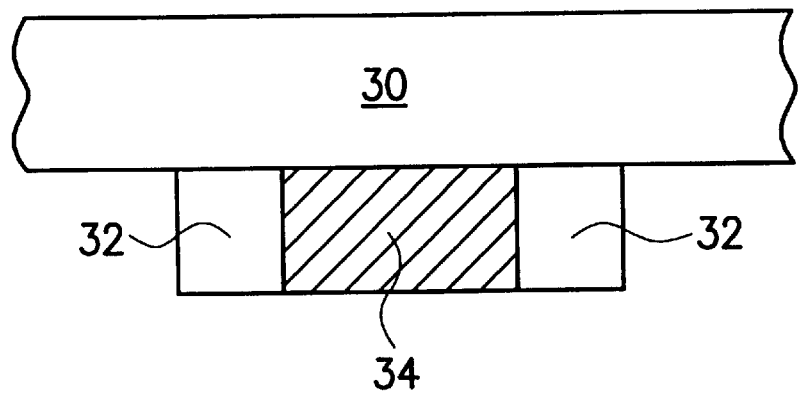
FIGS. 3A–3C are schematic cross-sectional diagrams used to depict the various structures of the first and second shifter layers utilized in the double-alternating PSM of the invention.
Figure 3B:
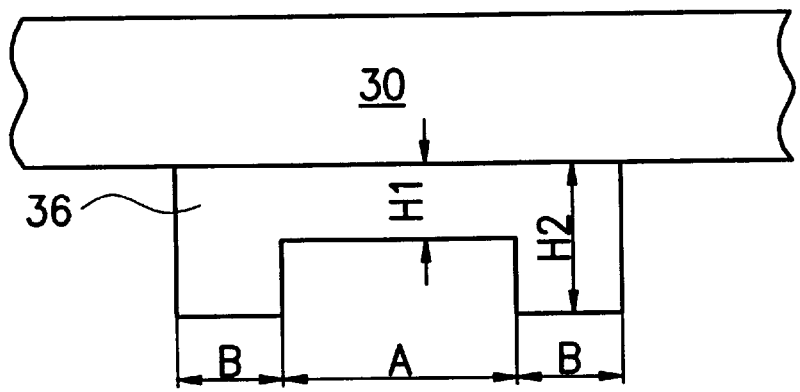
Figure 3C:
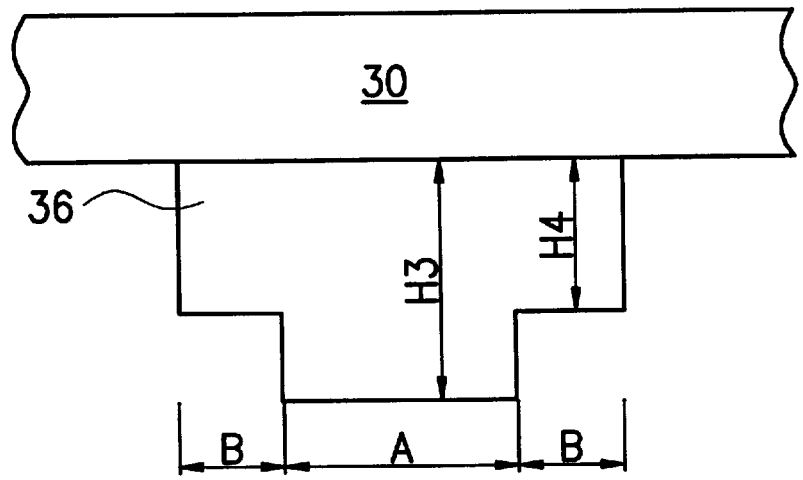

FIGS. 3A–3C are schematic cross-sectional diagrams used to depict the various structures of the first and second shifter layers utilized in the double-alternating PSM of the invention.

In FIG. 3A, the quartz substrate is designated by the reference numeral 30, the first shifter layer is designated by the reference numeral 32 and the second shifter layers are designated by the reference numeral 34. In this example, the first and second shifter layers 32, 34 are made from two different optical materials which are semi-transparent in light transmission property with a light transmittance of 3% to 10%. The first shifter layer 32 can cause a phase shift of 180° to the light passing through it, while the second shifter layers 34 can cause a phase shift of 0° to the light passing through it.

In FIG. 3B, the quartz substrate is designated by the reference numeral 30. In this example, the above-mentioned first and second shifter layers are here an integrally formed piece 36 of the same optical material which is semi-transparent in light transmission property with a light transmittance of 3% to 10%. The integrally formed piece 36 includes two portions: a thin portion A with a thickness of H1 to serve as the above-mentioned second shifter layer and a thick portion B with a larger thickness of H2 (H2>H1) to serve as the above-mentioned first shifter layer. It is a well-known principle in optics that the phase shift caused by a piece of light-transmitting substance is related to its thickness. Therefore, the thicknesses H1, H2 can be suitably prescribed from mathematical deductions so as to provide the above-mentioned phase difference of 180° between the light passing through the thin area A and the light passing through the thick area B.

Referring to FIG. 3C, this example is similar to the previous example of FIG. 3B except that the second shifter layer is here formed from a thicker, instead of a thinner, portion of the integrally formed piece 36, and the first shifter layer is here formed from a thinner, instead of a thicker, portion of the integrally formed piece 36. Fundamentally, the integrally formed piece 36 shown here includes two portions: a thick portion A with a thickness of H3 to serve as the above-mentioned second shifter layer and a thin portion B with a thinner thickness of H4 (H4<H3) to serve as the above-mentioned first shifter layer. Similar to the example of FIG. 3B, the thicknesses H3, H4 can be suitably prescribed from mathematical deductions so as to provide the above-mentioned phase difference of 180° between the light passing through the thick area A and the light passing through the thin area B.

The foregoing PSM of the invention provides the double-alternating feature that allows a 180° phase difference between the light passing through the first shifter layer 22 and the light passing through the second shifter layers 24, thus leading to a destructive interference that can eliminate the ghost lines that would otherwise occur. Moreover, the invention can allow an increase in resolution and contrast of the resulted pattern definition.

Figure 4A:
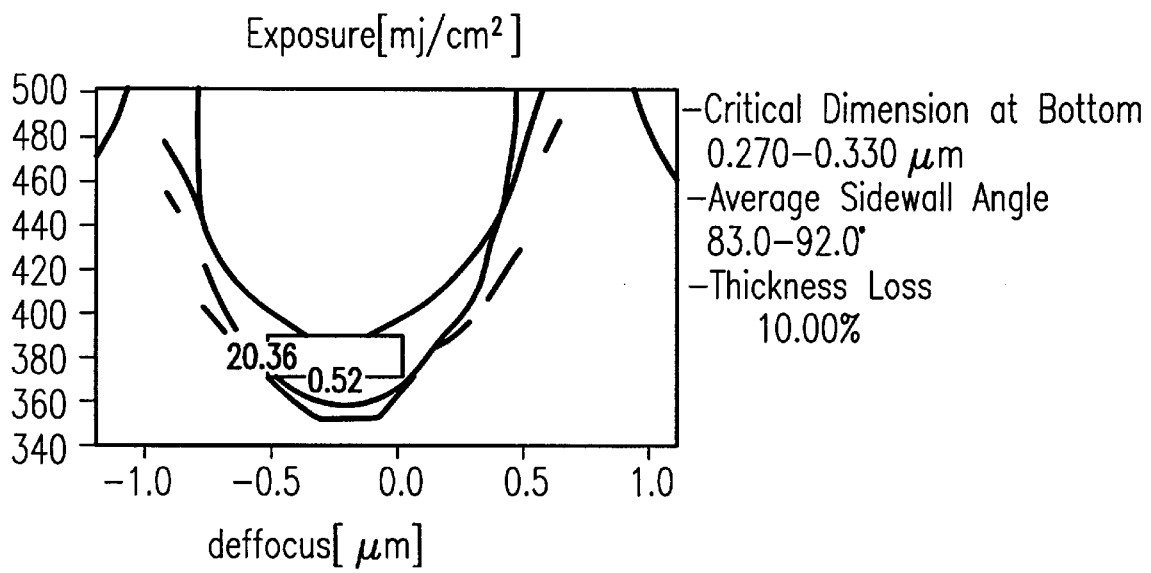
FIGS. 4A–4B are graphs showing the process windows of the double-alternating PSM of the invention as compared to the conventional HTPSM.
Figure 4B:
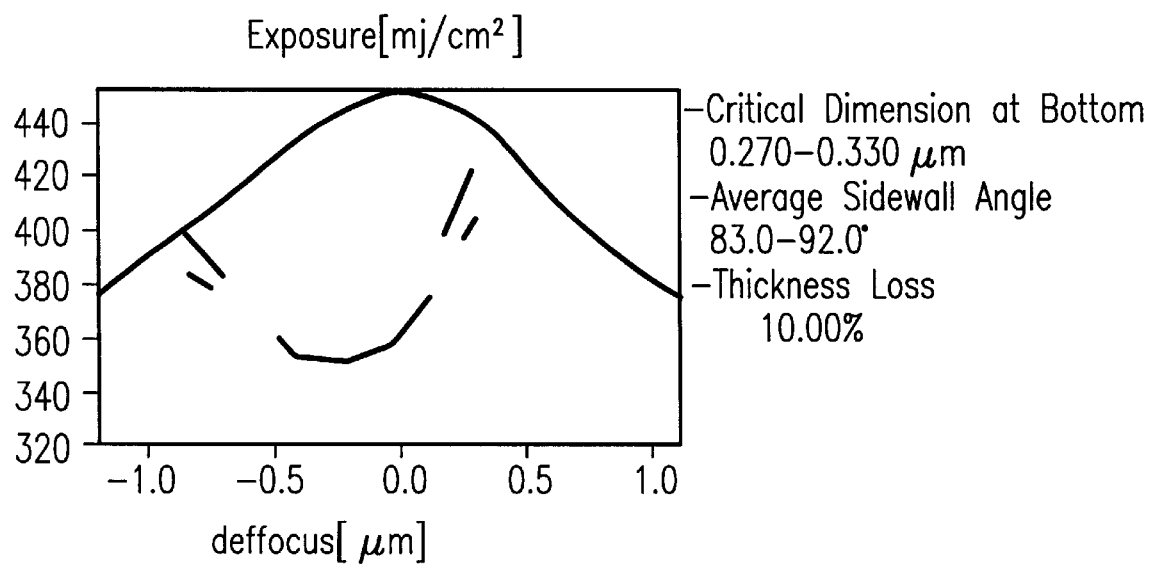

FIGS. 4A–4B are graphs showing the process windows of the double-alternating PSM of the invention as compared to the conventional HTPSM. Assume the critical dimension at bottom is set at a value between 0.27 μm (micrometer) and 0.33 μm, the average sidewall angle is at a value between 82° and 92° and the thickness loss is set at 10%. Based on these assumptions, the process window of the double-alternating PSM of the invention and that of the conventional HTPSM are analyzed and the results are respectively illustrated in FIG. 4A and FIG. 4B. As shown in FIG. 4A, with the double-alternating PSM of the invention, the dispersion window is about 0.52 μm and the exposure window is about 20.36 mJ/cm$^2$. In contrast, the conventional HTPSM has no dispersion window and no exposure window. It can be learned from FIGS. 4A–4B that the double-alternating PSM of the invention is more advantageous than the conventional HTPSM.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A double-alternating phase-shifting mask for use in a photolithographic process for pattern definition of contact holes in semiconductor fabrication, which comprises:

a quartz substrate; and a masked area formed on said quartz substrate with the unmasked areas being defined as contact hole patterns, said masked area including:

a first shifter layer formed over said quartz substrate; and second shifter layers formed over said quartz substrate at those positions each substantially in the geometric center of each group of neighboring contact hole patterns.

2. The double-alternating phase-shifting mask of claim 1, wherein said first shifter layer is capable of causing a first phase shift to the light passing through it and said first shifter layer is capable of causing a second phase shift to the light passing through it, wherein the difference between the first phase shift and the second phase shift is substantially 180°.

3. The double-alternating phase-shifting mask of claim 2, wherein the first phase shift is 180°.

4. The double-alternating phase-shifting mask of claim 2, wherein the second phase shift is 0°.

5. The double-alternating phase-shifting mask of claim 1, wherein said first and second shifter layers are made from the same optical material, but with different thicknesses.

6. The double-alternating phase-shifting mask of claim 1, wherein said first and second shifter layers are made from different optical materials.

7. The double-alternating phase-shifting mask of claim 1, wherein said first shifter layer has a light transmittance of 3% to 10%.

8. The double-alternating phase-shifting mask of claim 1, wherein said second shifter layers each have a light transmittance of 3% to 10%.

* * * * *